United States Patent [19]

Murakami et al.

[11] Patent Number: 5,323,340
[45] Date of Patent: Jun. 21, 1994

[54] SEMICONDUCTOR INTEGRATED CIRCUIT

[75] Inventors: Hiroaki Murakami, Tokyo; Akira Takiba, Yokohama, both of Japan

[73] Assignee: Kabushiki Kaisha Toshiba, Kawasaki, Japan

[21] Appl. No.: 645,401

[22] Filed: Jan. 24, 1991

[30] Foreign Application Priority Data

Jan. 26, 1990 [JP] Japan ................................. 2-17302

[51] Int. Cl.[5] ...................... G11C 11/40; G11C 11/34; G11C 13/00
[52] U.S. Cl. ......................................... 365/63; 365/51
[58] Field of Search .................. 365/63, 230.3, 230.1, 365/189.08; 307/465

[56] References Cited

U.S. PATENT DOCUMENTS

| | | | |
|---|---|---|---|
| 4,418,399 | 11/1983 | Sakurai | 365/63 |
| 4,456,977 | 6/1984 | Hayashi | 365/63 |
| 5,072,425 | 12/1991 | Kohno et al. | 365/63 |
| 5,101,371 | 3/1992 | Yamada | 365/63 |

FOREIGN PATENT DOCUMENTS

| | | |
|---|---|---|
| 0031659 | 7/1981 | European Pat. Off. |
| 0307912 | 3/1989 | European Pat. Off. |
| 55-42344 | 3/1980 | Japan |

Primary Examiner—Eugene R. LaRoche
Assistant Examiner—Viet Q. Nguyen
Attorney, Agent, or Firm—Banner, Birch, McKie & Beckett

[57] ABSTRACT

A semiconductor integrated circuit of the present invention comprises a memory cell array and sense amplifiers connected to memory cells in the memory cell array through read lines and having a pattern width greater than the pattern width of the memory cells. The sense amplifiers are arranged in a matrix.

14 Claims, 8 Drawing Sheets

SEMICONDUCTOR INTEGRATED CIRCUIT

BACKGROUND OF THE INVENTION

1. Field of the Invention

The present invention relates to an improved layout of a semiconductor integrated circuit such as a programmable logic array (PLA), and more particularly, to an arrangement of sense amplifiers each having a pattern width greater than that of a memory cell in a memory cell array.

2. Description of the Related Art

A conventional PLA has a structure, for example, as shown in FIG. 1. In FIG. 1, numerals in0 to in2 denote input signals, 41 a control input buffer, and an AND array section (User programable AND array). The AND array section can program the presence/absence of connection between its input and output lines. Numerals SA10 to SA15 denote sense amplifiers having input terminals connected to the output lines of the AND array section. Symbol OR denotes an OR array section (User programable OR array). The OR array section can program the presence/absence of connection between its input lines (output lines of sense amplifiers SA10 to SA15) and its output lines. Numerals SA20 to SA23 denote sense amplifiers having input terminals connected to the output lines of the OR array section.

The programming devices employed in the AND array section and OR array section are, for example, erasable programmable read-only memories (EPROMs) or electrically erasable programmable read-only memories (EEPROMs).

FIG. 2 is a circuit diagram showing a circuit in which EEPROM cells 50 are used as programming devices in the AND array section. Each output line (product terms) of the AND array section is connected to a sense amplifier SAi (i=0 . . . 5) having a CMOS (complementary insulated gate type) structure.

FIG. 3 is a circuit diagram showing a circuit in which EEPROM cells 50 are used as programming devices in the OR array section. Each output line (product terms) of the OR array section is connected to a CMOS sense amplifier SA2i (i=0 . . . 3).

In FIGS. 2 and 3, the EEPROM cell 50 is constructed such that a floating gate type memory cell transistor 51 and a memory cell selection MOS transistor 52 are connected in series. One end of the memory cell transistor 51 is connected to a read line RLi or RLi'. A control gate of the memory cell transistor 51 is connected to a control gate line CG. One end of the memory cell section transistor 52 is connected to a write line WLi or WLi'. In the AND array section, a gate of each memory cell selection transistor 52 is connected to one of complementary output lines RG0, $\overline{RG0}$ to RG2, $\overline{RG2}$ of the control input buffer 41. In the OR array section, the gate of each memory cell selection transistor 52 is connected to one of outputs 0 to 5 of sense amplifiers SA10 to SA15.

Each of the CMOS sense amplifiers SA1i and SA2i, when they have static structures as shown in FIGS. 2 and 3, comprises seven P-channel transistors TP and four N-channel transistors TN. In addition, complementary pre-charge signals PR, $\overline{PR}$ are used as control signals.

Normally, each memory cell 50 is fabricated with a minimum design standard. By contrast, the sense amplifier SA1i (SA2i) cannot be manufactured with a minimum design standard. The reason is that the sense amplifiers SA1i and SA2i must sense a slight change in the state of the read line RLi connected to memory cell 50 and also quickly amplify and transmit the signal of the read line RLi. Furthermore, the sense amplifier SA1i (SA2i) requires 11 transistors in relation to the two transistors 51 and 52 of memory cell 50. Thus, the pattern width of the sense amplifier SA1i (SA2i) is considerably greater than that of the memory cell 50.

In the conventional PLA, however, the sense amplifiers SA1i (SA2i) connected to corresponding output lines are arranged in a line. The pattern of the PLA shown in FIG. 1 is shown in FIG. 4. As can be understood from FIG. 4, the total width of the sense amplifiers on the output side of the AND array section is greater than the total width of the AND array width and control input buffer. Similarly, the total width of the sense amplifiers on the output side of the OR array section is greater than the total width of the OR array section.

In addition, a wiring region 70 must be provided to connect the memory cells 50 and the sense amplifiers SA1i and SA2i. The wiring region 70 becomes larger, as the ratio of the total width of the sense amplifiers to that of the memory cells increases and as the number of output lines increases. The increase in wiring region 70 results in an increase in die size of the PLA integrated circuit. Further, the read lines RLi and RLi' connected to the memory cells 50 become longer. As a result, the load capacitance and resistance of read lines RLi and RLi' increase and the read-out operation speed cannot be increased.

SUMMARY OF THE INVENTION

The present invention has been devised to solve the above problem, and its object is to make the total width of the sense amplifiers smaller than the width of the memory cell array, to reduce the wiring region for connecting the memory cells and the sense amplifier, to reduce the die size and to increase the read operation speed.

In order to achieve the above object, there is provided a semiconductor integrated circuit comprising a memory cell array (AND, OR) and sense amplifiers (SAi) connected to memory cells in the memory cell array through read lines (RLi) and having a pattern width greater than the pattern width of the memory cells, characterized in that the sense amplifiers are arranged in a matrix.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 1:
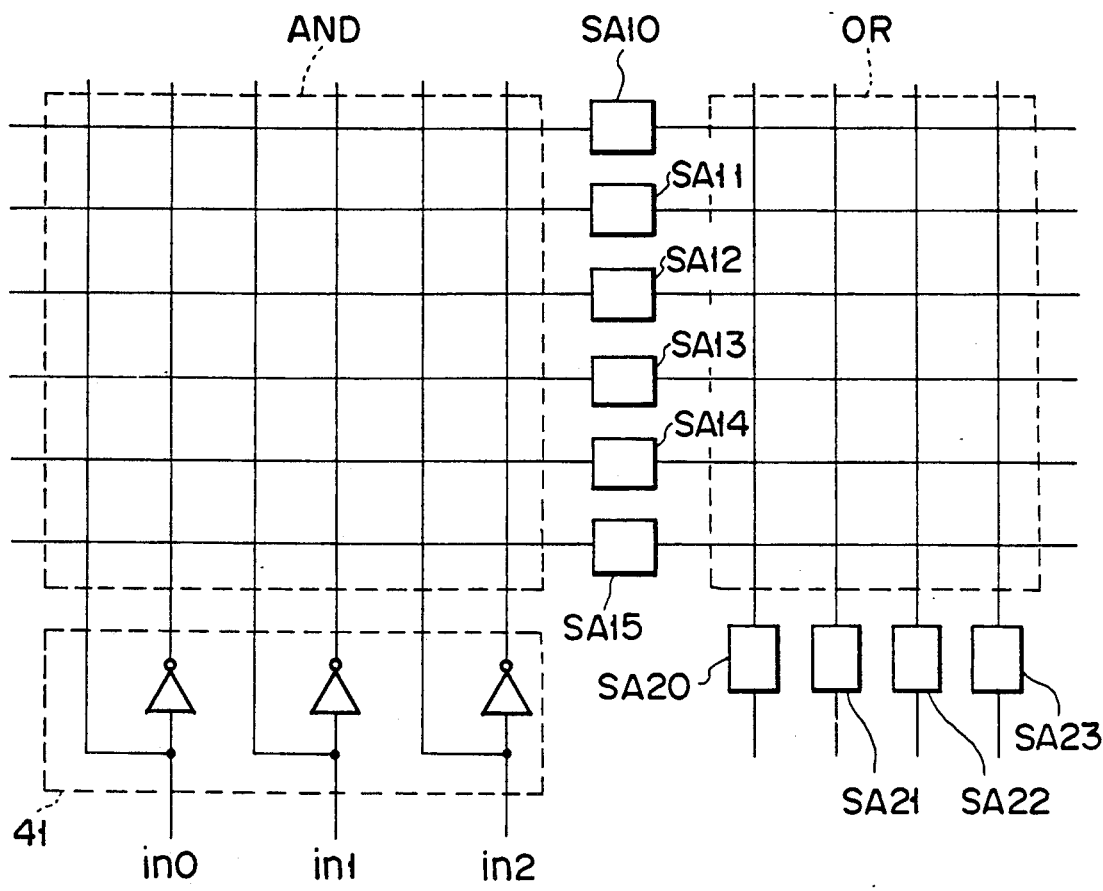
FIG. 1 is a block diagram showing a basic structure of a PLA.
Figure 2:
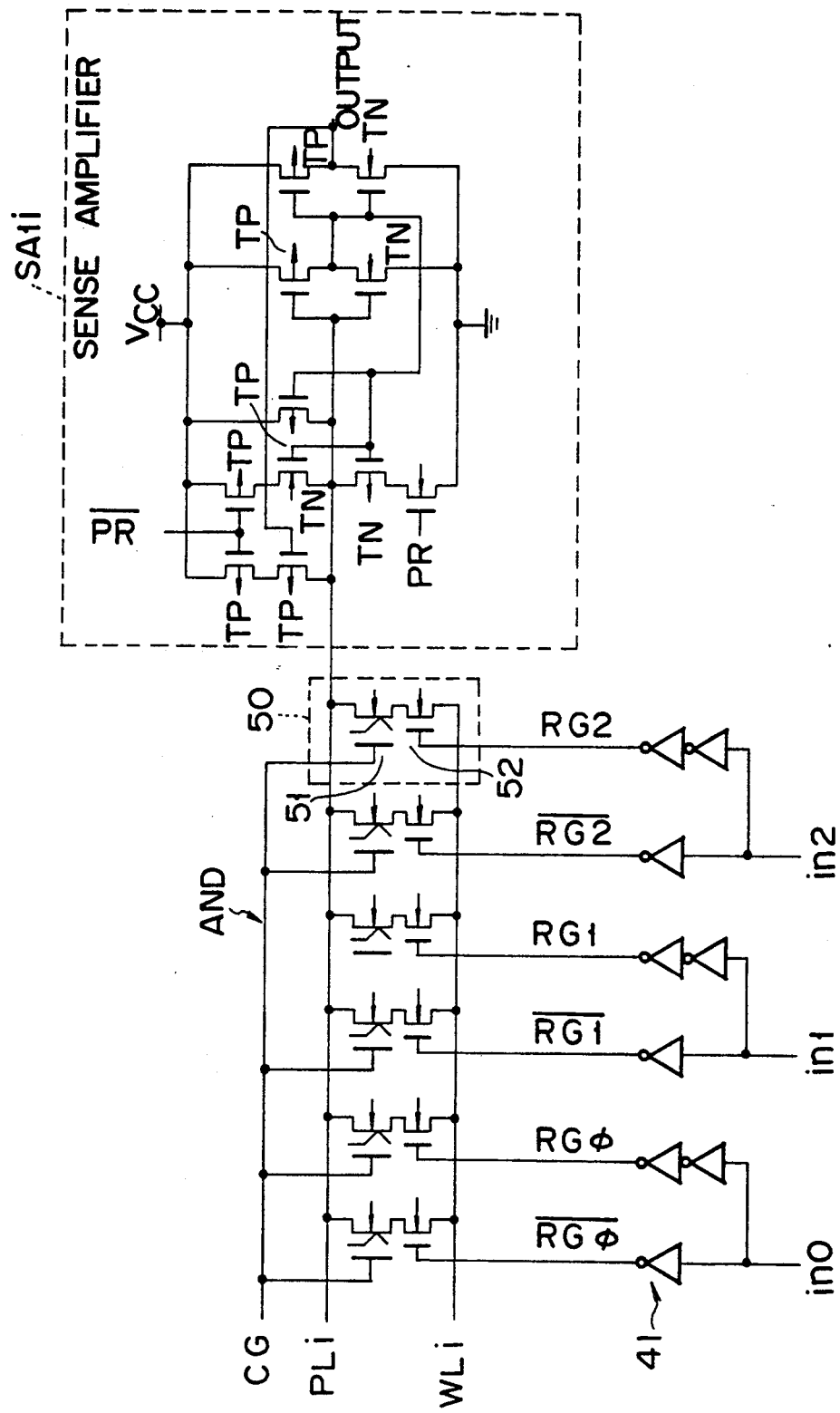
FIG. 2 is a circuit diagram showing one output line of the AND array section shown in FIG. 1, in which EEPROM cells are used as programming devices, and a sense amplifier connected to the output line.
Figure 3:
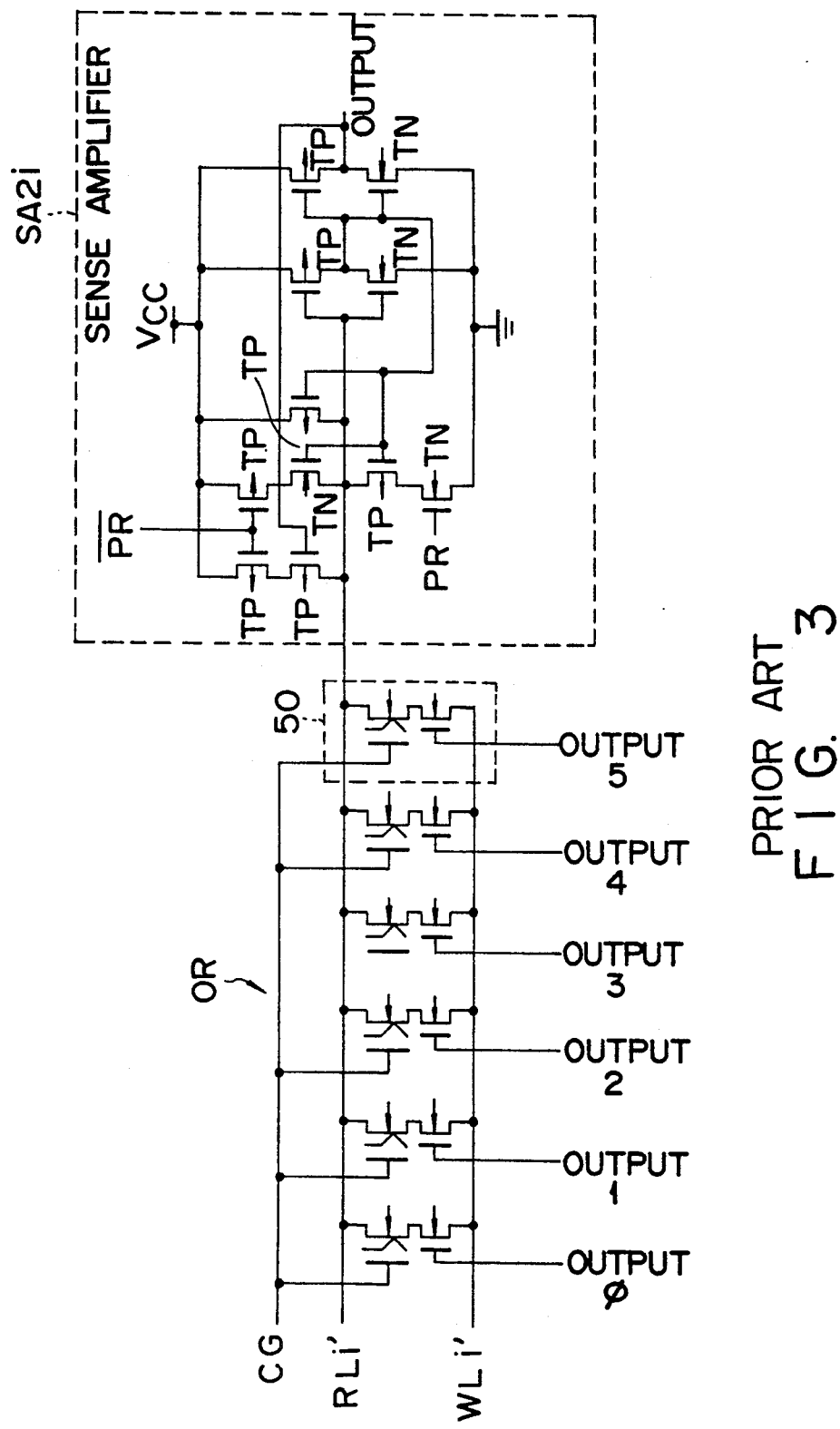
FIG. 3 is a circuit diagram showing one output line of the OR array section, in the case where EEPROM cells are used as programming devices in the OR array section (in FIG. 1), and a sense amplifier connected to the output line.
Figure 4:
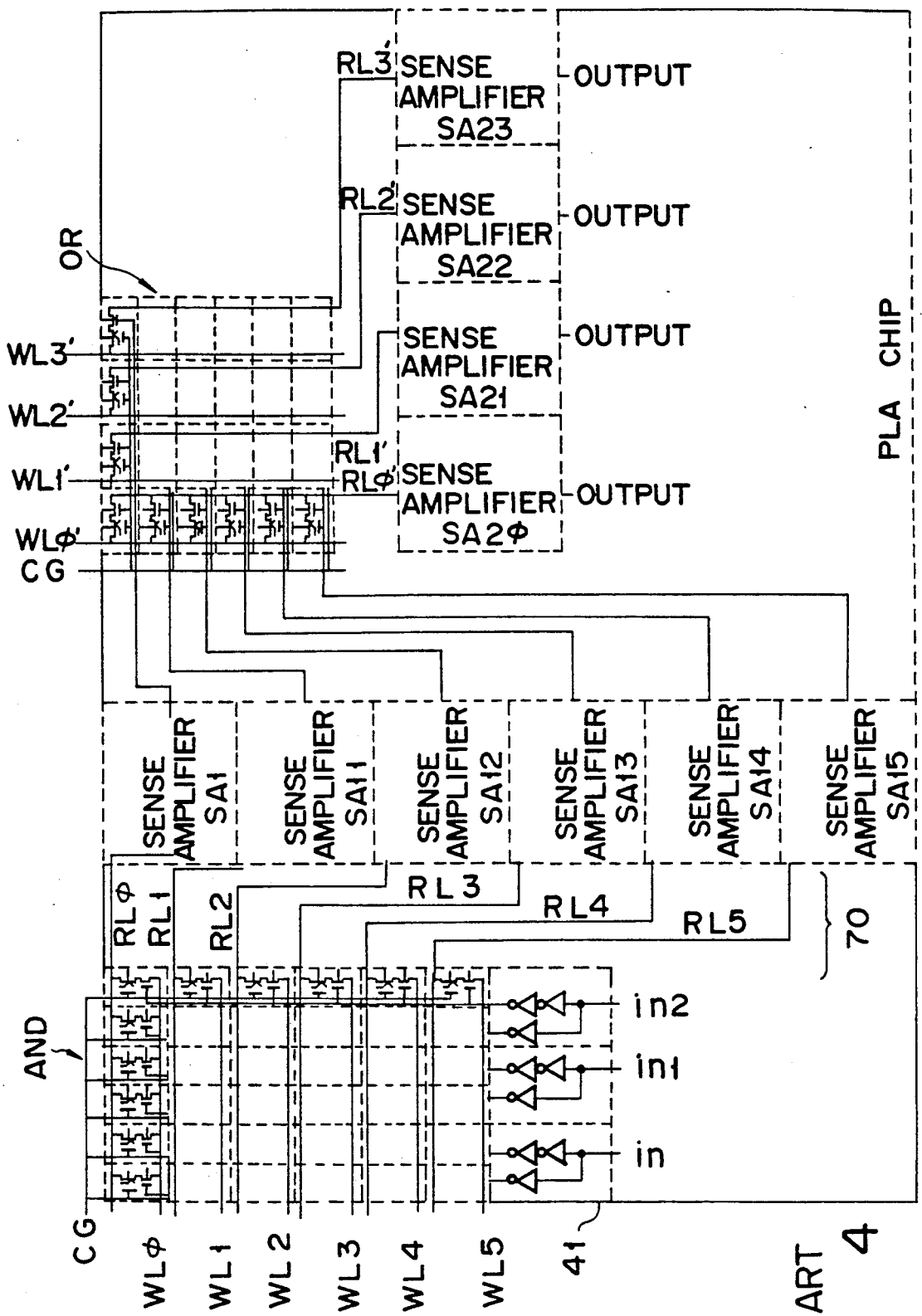
FIG. 4 shows a conventional design pattern of the PLA shown in FIG. 1.
Figure 5:
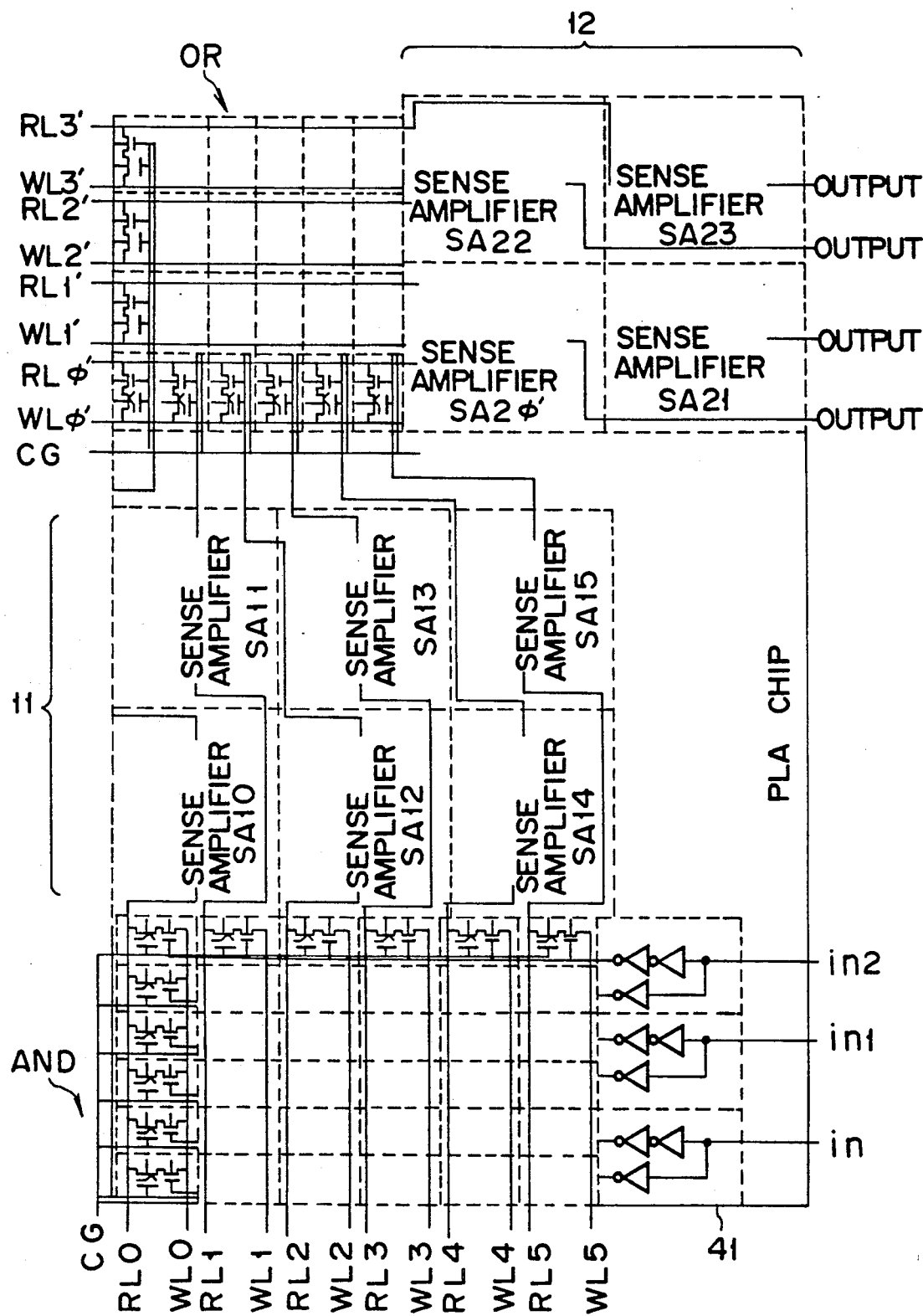
FIG. 5 shows a pattern of a PLA according to an embodiment of the present invention.

FIG. 5 shows a basic structure of a PLA according to an embodiment of the invention. The PLA structure of FIG. 5 differs from that of FIG. 4 in that sense amplifiers SAi are arranged in a plurality of lines in the region except the signal wiring region. Specifically, there are provided a first sense amplifier array 11 and a second sense amplifier array 12. In FIGS. 1 and 4, common structural elements are denoted by like reference numerals, and a detailed description thereof is omitted.

In the PLA shown in FIG. 5, the AND array section AND has six input lines and six output lines. The sense amplifiers SA10 to SA15 composing the first sense amplifier array 11 are arranged in a matrix of 3×2. The OR array section OR has six input lines and four output lines. The sense amplifiers SA20 to SA23 constituting the second sense amplifier array 12 are arranged in a matrix of 2×2.

The sense amplifier SA10 (in the first row and first column) in the first sense amplifier array 11 has an input terminal connected to the first output line of the AND array section AND and an output terminal connected to the first input line of the OR array section OR. The sense amplifier SA11 (in the first row and second column) has an input terminal connected to the second output line of the AND array section AND and an output terminal connected to the second input line of the OR array section OR. The sense amplifier SA12 (in the second row and first column) has an input terminal connected to the third output line of the AND array section AND and an output terminal connected to the third input line of the OR array section OR. The sense amplifier SA13 (in the second row and second column) has an input terminal connected to the fourth output line of the AND array section AND and an output terminal connected to the fourth input line of the OR array section OR. The sense amplifier SA14 (in the third row and first column) has an input terminal connected to the fifth output line of the AND array section AND and an output terminal connected to the fifth input line of the OR array section OR. The sense amplifier SA15 (in the third row and second column) has an input terminal connected to the sixth output line of the AND array section AND and an output terminal connected to the sixth input line of the OR array section OR. The first output line of the OR array section OR is connected to an input terminal of the sense amplifier SA20 (in the first row and first column) of the second sense amplifier array 12. The second output line is connected to an input terminal of the sense amplifier SA21 (in the first row and second column). The third output line is connected to an input terminal of the sense amplifier SA22 (in the second row and second column). The fourth output line is connected to an input terminal of the sense amplifier SA23 (in the second row and second column).

As can be seen from FIG. 5, the total width of the sense amplifiers in the first sense amplifier array 11 (the longitudinal length of the sense amplifier array) is smaller than the total of the width of the AND array and the width of the control input buffer. The total width of the sense amplifiers in the second sense amplifier array 12 is substantially equal to the width of the OR array. The total length (in the row direction) of the OR array section OR and second sense amplifier array 12 is substantially equal to the total width of the AND array and control input buffer. The sense amplifiers SA10 to SA15 of the first sense amplifier array 11 are arranged in a matrix of 3×2, on the output side of the AND array section AND having six input lines and six output lines. Thus, a wiring region for connecting the AND array section AND and first sense amplifier array 11 is made unnecessary. The sense amplifiers SA20 to SA23 of second sense amplifier array 12 are arranged in a matrix of 2×2, on the output side of the OR array section OR having six input lines and four output lines. Thus, a wiring region for connecting the OR array section OR and second sense amplifier array 12 is made unnecessary. Accordingly, compared to the construction shown in FIG. 4, the chip size can be remarkably reduced and the read lines RLi and RLi' extending from memory cells 50 can be shortened. In addition, the load capacitance and resistance of the PLA are decreased and the operation speed is increased.

Figure 6:
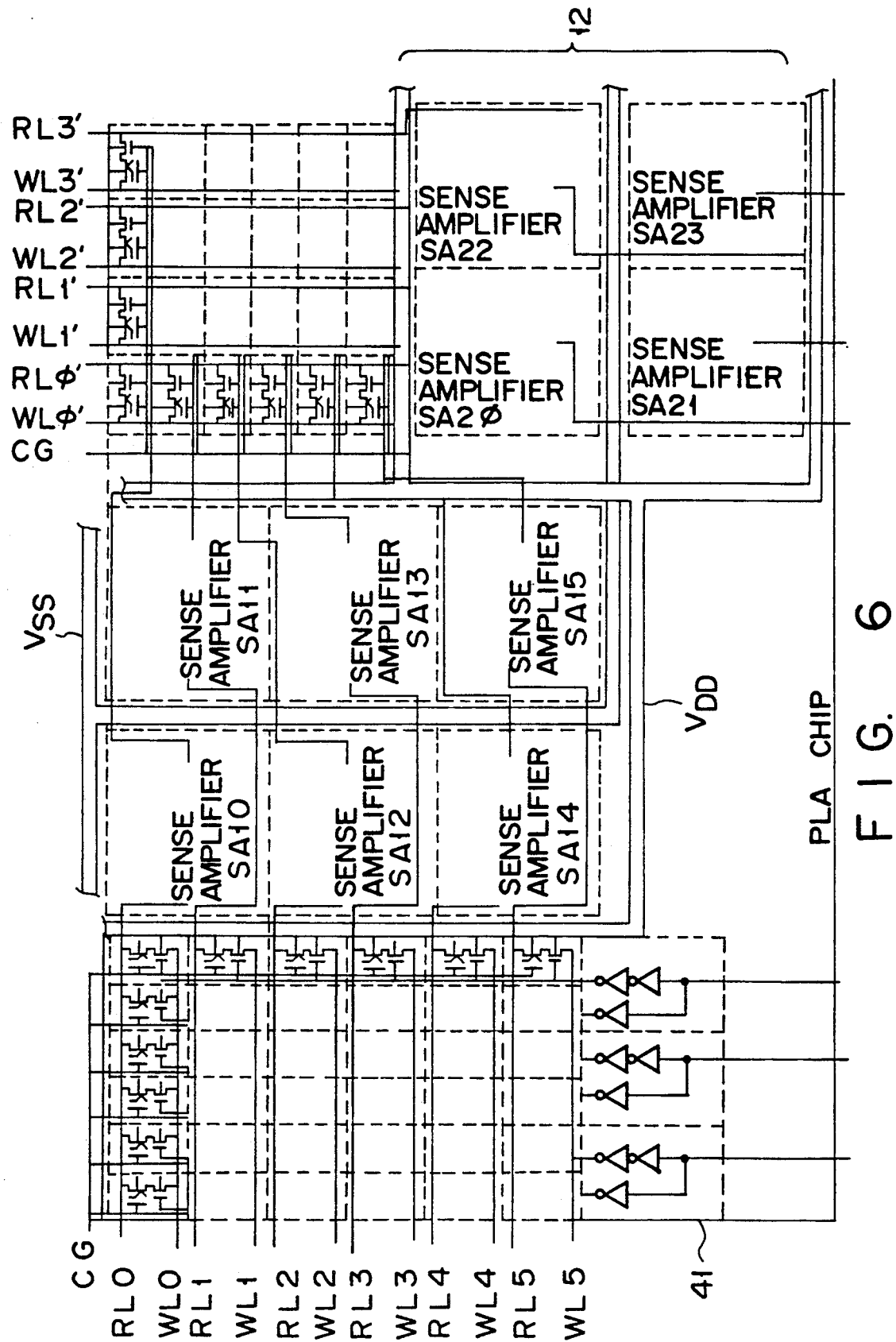
FIG. 6 shows a pattern in which power lines are arranged within the sense amplifier array shown in FIG. 5.

As is shown in FIG. 6, within the sense amplifier array, a first power line VDD can be situated at least at one space between rows or columns. In addition, a second power line VSS can be situated at least at another space between rows or columns. This makes it possible to efficiently arrange the power lines within the PLA chip.

The above embodiment is directed to the PLA having both AND array section AND and OR array section OR. The present invention, however, is also applicable to a PLA having at least either AND array section AND or OR array section OR. In general, the present invention is advantageously applicable to the case where the width of the sense amplifier array becomes greater than the total width of the memory cells and cell control input circuit when the sense amplifiers are arranged in a matrix, as well as to the case where the width of the wiring region for connecting the memory cells and sense amplifiers becomes greater than the width of the sense amplifier array.

Figure 7:
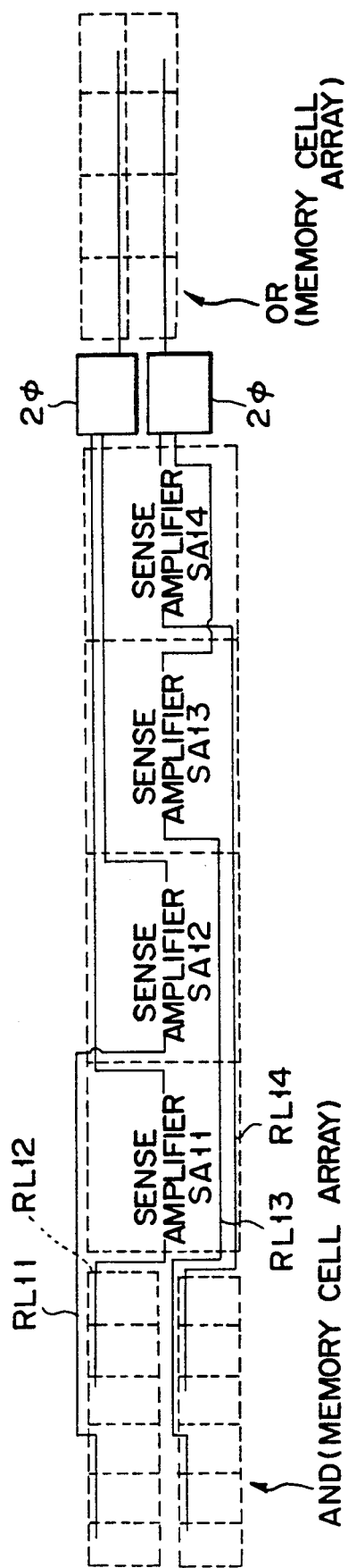
FIGS. 7 and 8 show patterns of PLAs according to other embodiments of the invention.

FIG. 7 shows a part of a PLA according to another embodiment of the invention. This embodiment is designed to decrease a delay in transmission of signals due to the parasitic capacitance of output signals. Each output line is divided lengthwise into portions. The output lines are connected to the corresponding input terminals of the sense amplifiers SAi. The outputs of the sense amplifiers SAi are supplied to OR gates 20, thus obtaining a logical sum. In this way, this invention is applicable to the case where one or more read lines RLi are connected to one row or one column of the memory cell array and the sense amplifiers SAi are connected to the corresponding read lines RLi.

Figure 8:
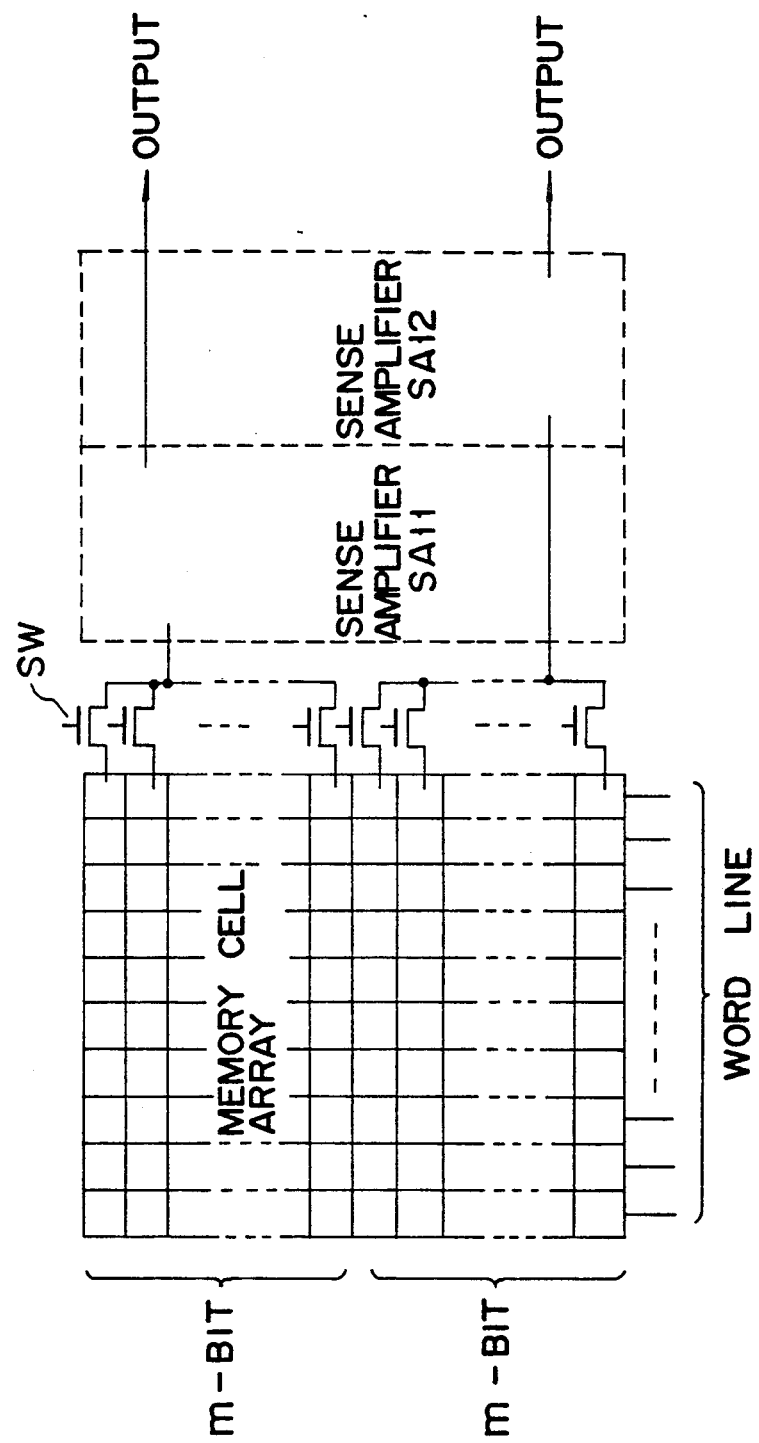

The present invention is also applicable to a PLA having a structure as shown in FIG. 8. In FIG. 8, one sense amplifier SAi is fabricated so as to have a width corresponding to a plurality (m) of rows (or columns) in the memory cell array. The m-rows in the memory cell array are connected selectively to one sense amplifier SAi by means of selection switch transistors SW.

The present invention is not limited to the above-described PLAs. For example, this invention is applicable to a semiconductor integrated circuit comprising a memory cell array and sense amplifiers having a pattern width greater than that of the memory cell array. By arranging the sense amplifiers in a matrix, the aforementioned advantages can be obtained.

According to the present invention, the sense amplifiers are arranged in a matrix, and the total width of the sense amplifiers in the sense amplifier array is less than the width of the memory cell array. Thus, the wiring region for connecting the memory cell array and sense amplifier array can be made unnecessary. Accordingly, the die size can be remarkably reduced, and the read lines from the memory cells can be shortened. In addition, the load capacitance and resistance of the read lines can be decreased and the read operation speed can be enhanced.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit, comprising:
   an input terminal;
   an output terminal;
   a first array portion including 11 first logic circuits sequentially arranged along a first direction;
   an input buffer portion having a first side adjacent to and in the first direction from a first side of said first array portion and including a plurality of input buffer circuits; and
   a second array portion having a first side adjacent to and in a second direction from a second side of said first array portion and including 11 first sense amplifiers arranged in a row and column matrix, wherein the second direction is perpendicular to the first direction, a dimension of each first sense amplifier in the first direction is greater than a dimension of each first logic circuit in the first direction and a dimension of said second array portion in the first direction is substantially equal to or less than a total dimension of said first array portion and said input buffer portion in the first direction.

2. The semiconductor integrated circuit according to claim 1, further comprising:
   a third array portion having a first side adjacent to and in the second direction from a second side of said second array portion and including 12 second logic circuits sequentially arranged along the second direction; and
   a fourth array portion having a first side adjacent to and in the first direction from a second side of said third array portion and including 12 second sense amplifiers arranged in a row and column matrix, wherein a dimension of each second sense amplifier in the second direction is greater than a dimension of each second logic circuit in the second direction and a dimension of said fourth array portion in the second direction is substantially equal to a dimension of said third array portion in the second direction.

3. The semiconductor integrated circuit according to claim 2, wherein a total dimension of said third array portion and said fourth array portion in the first direction is substantially equal to the total dimension of said first array portion and said input buffer portion in the first direction.

4. The semiconductor integrated circuit according to claim 3, wherein said first and third array portions are programmable logic arrays (PLAs).

5. The semiconductor integrated circuit according to claim 3, wherein said first logic circuits are AND circuits and said second logic circuits are OR circuits.

6. The semiconductor integrated circuit according to claim 3, wherein said input buffer circuits are connected to said input terminal, said first array portion is connected to said input buffer circuits and to said second array portion, said third array portion is connected to said second array portion and to said fourth array portion, and said fourth array portion is connected to said output terminal.

7. The semiconductor integrated circuit according to claim 3, further comprising:
   power lines arranged between the rows and/or columns of sense amplifiers of said second array portion.

8. The semiconductor integrated circuit according to claim 3, further comprising:
   power lines arranged between the rows and/or columns of sense amplifiers of said fourth array portion.

9. The semiconductor integrated circuit according to claim 1, further comprising:
   power lines arranged between the rows and/or columns of sense amplifiers of said second array portion.

10. A semiconductor integrated circuit, comprising:
    a first array portion including 11 first logic circuits arranged in a row and column matrix, wherein each row includes at least two first logic circuits;
    11 data lines each respectively connected to one of said first logic circuits;
    a second array portion having a first side adjacent to and in a row direction from a first side of said first array portion and including 11 sense amplifiers each respectively coupled to one of said data lines and sequentially arranged in the row direction, wherein a dimension of each sense amplifier in the column direction is greater than a dimension of each first logic circuit in the column direction and a dimension of said second array portion in the column direction is substantially equal to or less than a dimension of said first array portion in the column direction;
    gate circuits each respectively coupled to the sense amplifiers connected to first logic circuits in one row of said row and column matrix for selecting an output of one of said sense amplifiers; and a third array portion having a first side in the row direction from a second side of said second array portion and including 12 second logic circuits sequentially arranged in a column direction.

11. The semiconductor integrated circuit according to claim 10, wherein said first and third array portions are programmable logic arrays (PLAs).

12. The semiconductor integrated circuit according to claim 10, wherein said first logic circuits are AND circuits and said second logic circuits are OR circuits.

13. The semiconductor integrated circuit according to claim 10, wherein said second array portion is connected to first array portion and said third array portion.

14. A semiconductor integrated circuit, comprising:
an input terminal;
an output terminal;
a first logic circuits including 11 first array elements;
an input buffer portion having a first side adjacent to and in a first direction from a first side of said first array portion and including a plurality of input buffer circuits;
a second array portion having a first side adjacent to and in a second direction from a second side of said first array portion and including 11 first sense amplifiers arrayed in a row and column matrix, wherein the second direction is perpendicular to the first direction, a dimension of each first sense amplifier in the first direction is greater than a dimension of each first array element in the first direction and a dimension of said second array portion in the first direction is substantially equal to or less than a total dimension of said first array portion and said input buffer portion in the first direction;
a third array portion having a first side adjacent to and in the second direction from a second side of said second array portion and including 12 third array elements sequentially arranged along the second direction; and
a fourth array portion having a first side adjacent to and in the first direction from a second side of said third array portion and including 12 second sense amplifiers arranged in a row and column matrix, wherein a dimension of each second sense amplifier in the second direction is greater than a dimension of each second logic circuit in the second direction and a dimension of said fourth array portion in the second direction is substantially equal to a dimension of said third array portion in the second direction.

* * * * *